United States Patent [19]
Smiley

[11] Patent Number: 5,808,486
[45] Date of Patent: Sep. 15, 1998

[54] GLITCH FREE CLOCK ENABLE CIRCUIT

[75] Inventor: David Alan Smiley, Peoria, Ariz.

[73] Assignee: AG Communication Systems Corporation, Phoenix, Ariz.

[21] Appl. No.: 842,104

[22] Filed: Apr. 28, 1997

[51] Int. Cl.$^6$ .................................................. H03K 5/00
[52] U.S. Cl. ............................................. 327/34; 327/294
[58] Field of Search ................................. 327/31–38, 291, 327/294, 172–176, 551, 552, 558, 559

[56] References Cited

U.S. PATENT DOCUMENTS

| | | | |
|---|---|---|---|
| 5,111,480 | 5/1992 | Sarkoezi | 327/176 |
| 5,537,062 | 7/1996 | Mote, Jr. | 326/93 |

FOREIGN PATENT DOCUMENTS

| | | | |
|---|---|---|---|
| 62-16615 | 1/1987 | Japan | 327/34 |

Primary Examiner—Tuan T. Lam
Attorney, Agent, or Firm—David J. Zwick; Gregory G. Hendricks

[57] ABSTRACT

A clock enabling circuit that generates an output clock signal such that when the enable output signal changes to a logical false, the output clock signal returns to its steady-state value in a manner that does not produce any glitches, and preserves the duty cycle of the input clock. The circuit comprises a first D flip-flop that is positive-edge triggered, a second D flip-flop that is negative-edge triggered, and a two-input AND gate. The first flip-flop has the D input connected to a constant positive voltage, the positive-edge triggered clock input connected to the input clock signal, the Q output connected to the AND gate, and the Q-complement output connected to the asynchronous reset of the second flip-flop. The second flip-flop has the D input connected to the enable output signal, the negative-edge triggered clock input connected to the input clock signal, the Q output connected to the asynchronous reset of the first flip-flop, and the Q-complement output connected to the AND gate. The output of the AND gate is the output clock signal.

5 Claims, 10 Drawing Sheets

5,808,486

GLITCH FREE CLOCK ENABLE CIRCUIT

FIELD OF THE INVENTION

The present invention relates to digital logic circuits and more particularly to a clock enable circuit that produces a glitch free clock signal.

BACKGROUND OF THE INVENTION

Many digital logic systems operate synchronously with a primary clock signal such that their logic circuits are triggered directly by the rising and falling edges of the primary clock signal, or are in circuits that are triggered indirectly by the primary clock signal through a chain of one or more logic circuits. Logic components in the circuits are such that they change states in a predictable manner at predictable times in relation to the rising and falling edges of the triggering clock signal. These logic systems often have circuits that are required to operate for a specific number of clock cycles and remain idle at other times. For example, a circuit may read a data frame into a register in a bit-by-bit operation that is synchronous with a clock signal, then wait and allow another circuit to process the data, then resume operation and read another data frame into the register. These circuits normally operate when a clock signal is enabled, and are idle when the clock signal is disabled. Thus, there is a need for a clock enable logic circuit that will produce an output clock signal based on an input clock signal, and having the same frequency, substantially the same duty cycle and a fixed phase relationship to the input clock signal.

It is possible to design a clock enable circuit that appears to satisfy the aforementioned requirements. However some designs will produce short pulses, or "glitches," in the output clock signal when the clock enable circuit disables the output clock. Glitches are particularly troublesome in logic circuits because they may cause unwanted logic transitions in downstream components, and they may not be transmitted through downstream components to a convenient test probe point making them difficult to detect.

Other prior art designs successfully take advantage of an input clock having a frequency that is, for example, twice the frequency of the desired output clock signal. However, not all logic systems provide a "2X"clock signal.

Accordingly, objects of the present invention include providing a clock enable circuit that will produce an output clock signal based on an input clock signal, and having the same frequency, similar duty cycle and a fixed phase relationship to the input clock signal. Another object of the invention is to provide a clock enable circuit that will start and stop the output clock signal such that only full pulses of the input clock signal are present in the output clock signal, and in particular, no glitches appear in the output clock signal.

SUMMARY OF THE INVENTION

The present invention provides a clock enabling circuit which generates an output clock signal having the same frequency, same duty cycle and a fixed phase relationship to an input clock signal when an enable signal is present. When the enable signal changes to a logical false, the output clock signal returns to its steady-state value in a manner that does not produce any glitches, and preserves the duty cycle of the input clock. The circuit comprises a first D flip-flop that is positive-edge triggered, a second D flip-flop that is negative-edge triggered, and a two-input AND gate. The first flip-flop has the D input connected to a constant positive voltage, the positive-edge triggered clock input connected to the input clock signal, the Q output connected to the AND gate, and the Q-complement output connected to the asynchronous reset of the second flip-flop. The second flip-flop has the D input connected to the enable output signal, the negative-edge triggered clock input connected to the input clock signal, the Q output connected to the asynchronous reset of the first flip-flop, and the Q-complement output connected to the AND gate. The output of the AND gate is the output clock signal.

DETAILED DESCRIPTION OF THE INVENTION

Figure 1:
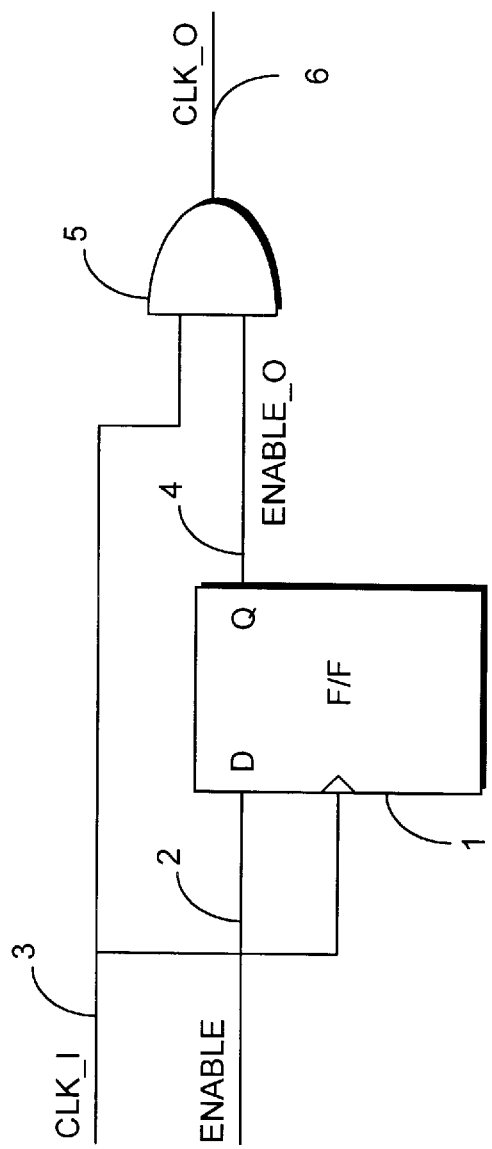
FIG. 1 shows a logic diagram that exemplifies a prior art circuit displaying a glitch in the output clock signal when the clock enable signal changes to a logical false.

FIG. 1 shows a logic diagram that exemplifies a prior art circuit displaying a glitch in the output clock signal when the clock enable signal changes to a logical false. Positive-edge triggered flip-flop 1 receives the clock enable signal ENABLE over D lead 2, the input clock signal CLK_I over lead 3, and generates an output signal ENABLE_O over Q lead 4. AND gate 5 receives signal CLK_I as one input over lead 3, signal ENABLE_O from flip-flop 1 as the other input over lead 4, and generates output clock signal CLK_O over lead 6.

Figure 2:
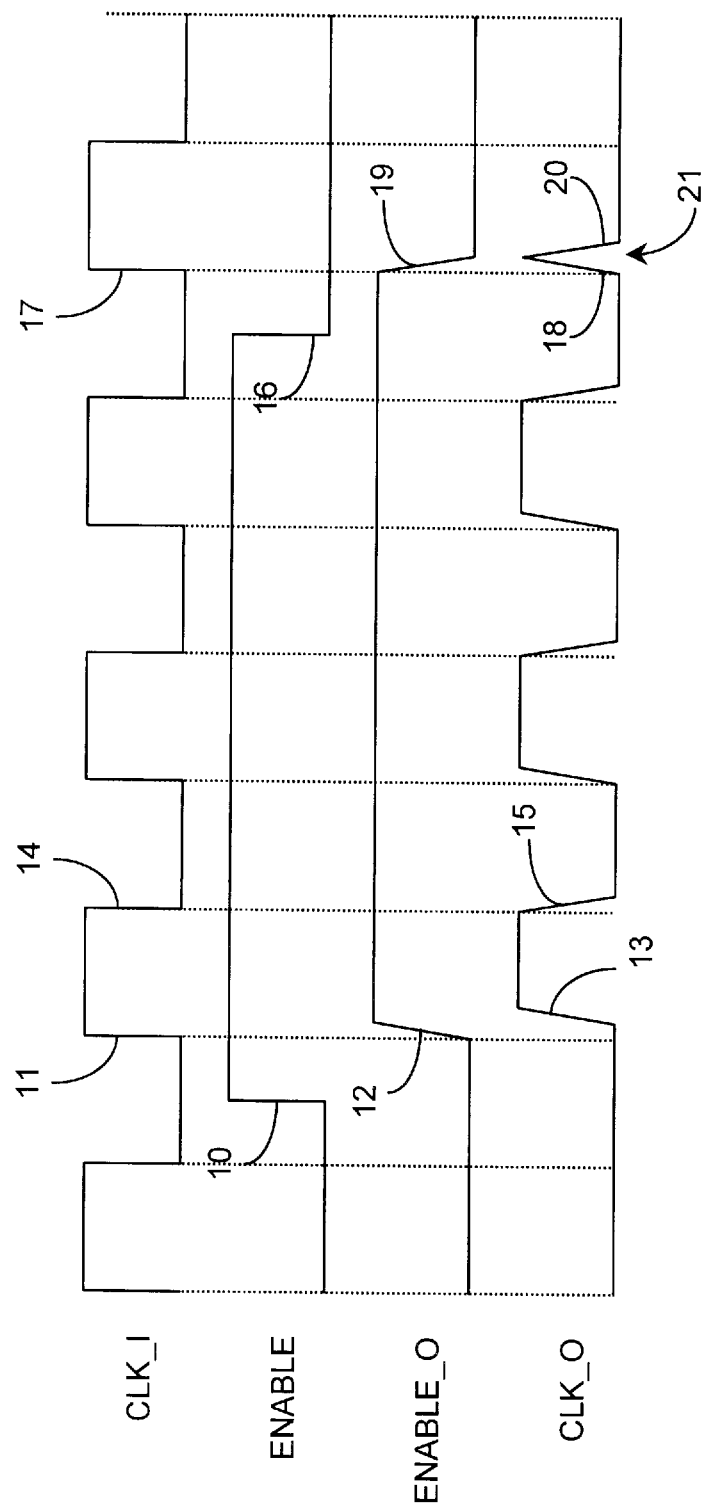
FIG. 2 shows the timing diagram associated with the circuit illustrated in FIG. 1.

FIG. 2 shows a timing diagram to assist in an understanding of the operation of the preceding circuit, and in particular, how a glitch can be generated. In FIG. 2, and the subsequent timing diagrams, a slanted signal trace at a transition between logic states is indicative of a propagation delay through a logic component that results in an output signal logic transition that occurs a finite time after the input signal logic transition is received.

As shown in FIG. 2, when signal ENABLE is asserted at 10, the next leading edge of signal CLK_I at 11 causes signal ENABLE_O to go high at 12 after a propagation delay through flip-flop 1. When signal ENABLE_O achieves high at 12, this in conjunction with signal CLK_I being high causes signal CLK_O from AND gate 5 to go high. Trailing edge 14 of signal CLK_I then causes signal CLK_O to go low at 15. With signal ENABLE remaining high, signal CLK_O will follow input clock signal CLK_I.

When signal ENABLE goes low at 16, the next leading edge of signal CLK_I at 17 causes signal CLK_O to transition to high at 18, because signal ENABLE_O is still high at this time. Leading edge 17 also causes signal ENABLE_O to transition to low at 19. When signal ENABLE_O achieves low at 19, this will cause signal CLK_O to transition to low at 20. Because there is a propagation delay in flip-flop 1, there is a race condition between signals ENABLE_O and CLK_I, and low signal ENABLE_O at 19 reaches AND gate 5 after signal CLK_I transitions to high at 17. This delay allows signal CLK_O to transition to high at 18 before low signal ENABLE_O at 19 immediately causes signal CLK_O to transition to low at 20. This transition of signal CLK_O to high at 18 followed immediately by a transition to low at 20 defines glitch 21. It can be seen that glitch 21 will occur regardless of the timing of transitions 10 and 16 of signal ENABLE.

This glitch may cause unwanted and unpredictable logic transitions in downstream components. Because of the typically very short duration of glitches, they may not be transmitted through all downstream components to a convenient test probe point making them potentially difficult to detect.

FIG. 2 also illustrates another problem with this exemplary prior art circuit. As can be seen, the first CLK_O pulse is shortened. This is caused by the propagation delay through flip-flop 1 of signal ENABLE_O at 12 when input clock signal CLK I changes to high at 11.

Figure 3:
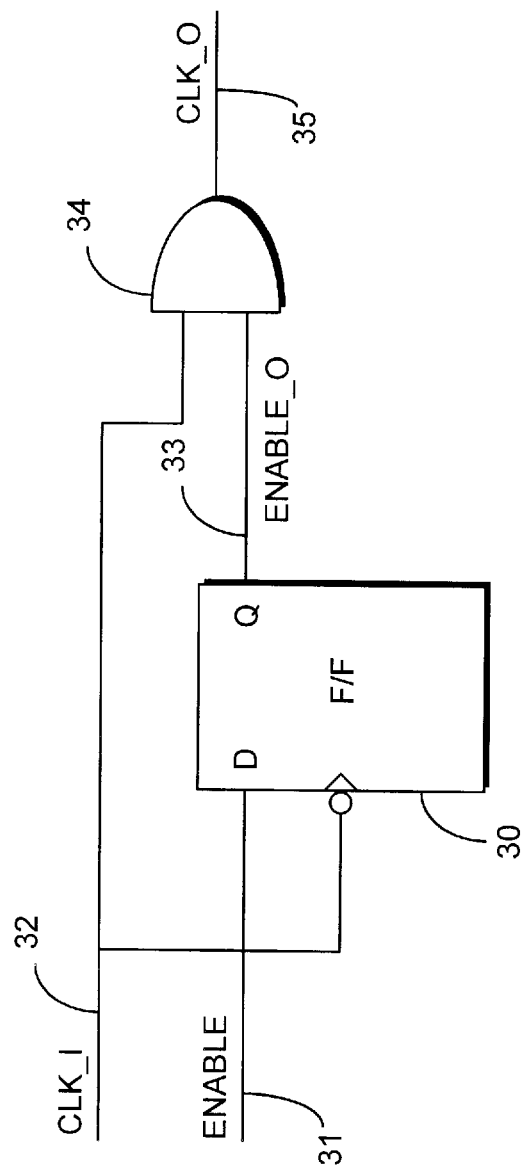
FIG. 3 shows a logic diagram of a prior art circuit that eliminates the glitch in the output clock signal.

FIG. 3 shows a logic circuit that is disclosed in U.S. Pat. No. 5,537,062 by Mote that overcomes the race-condition problem of the circuit illustrated in FIG. 1 and generates a clock output signal that doesn't have glitches. Negative-edge triggered flip-flop 30 receives the clock enable signal ENABLE over D lead 31, the input clock signal CLK_I over lead 32, and generates an output signal ENABLE_O over Q lead 33. AND gate 34 receives signal CLK_I as one input over lead 32, signal ENABLE_O from flip-flop 30 as the other input over lead 33, and generates output clock signal CLK_O over lead 35. As can be seen, this circuit comprises the same components as the circuit f FIG. 1, with the exception that flip-flop 30 is negative-edge triggered, whereas flip-flop 1 is positive edge triggered.

Figure 4:
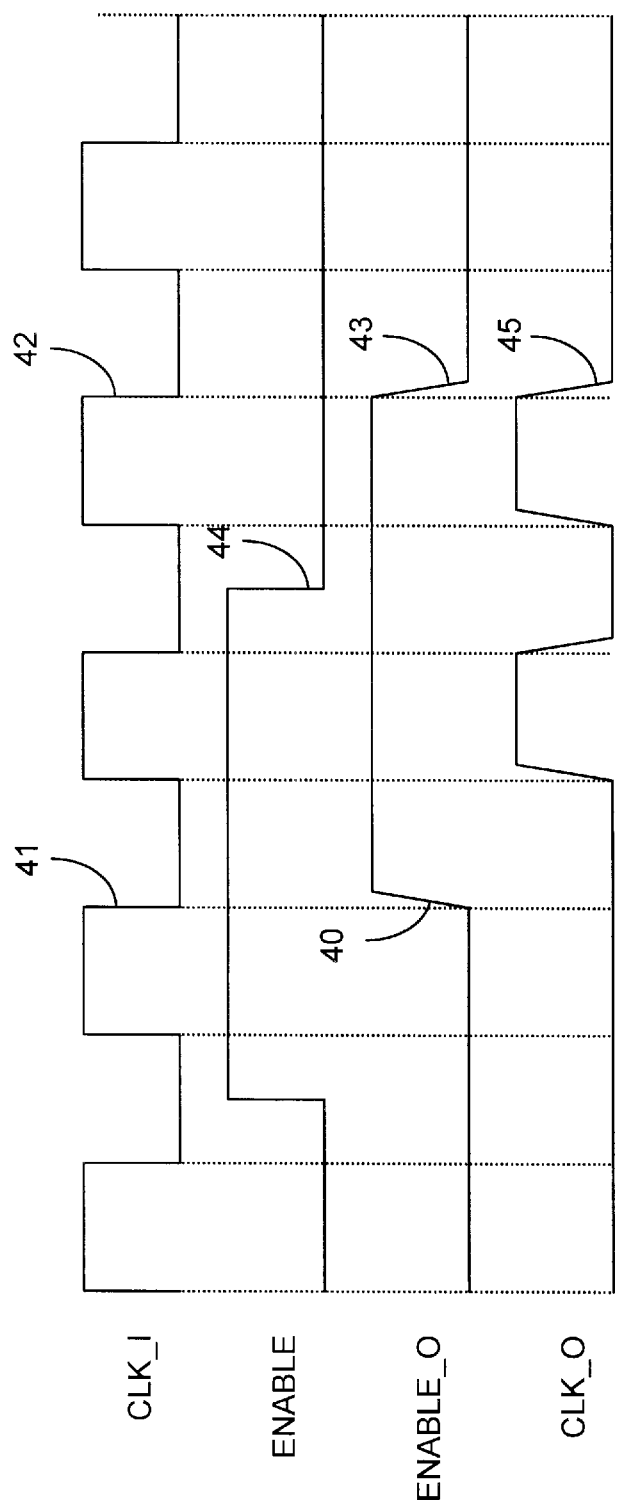
FIG. 4 shows a first timing diagram associated with the circuit illustrated in FIG. 3.

FIG. 4 shows the timing diagram for the circuit of FIG. 3. In contrast to the circuit of FIG. 1, signal ENABLE_O transitions on the negative, or trailing, edge of signal CLK_I, as shown at 40, where ENABLE_O is transitioning to high in response to trailing edge 41 of signal CLK_I, and at 42, where ENABLE_O is transitioning to low in response to trailing edge 43 of signal CLK_I. As shown in FIG. 4, signal ENABLE going low at 44 causes the next trailing edge of signal CLK_I a 42 to, in turn, cause signal ENABLE_O to go low at 43. Signal ENABLE_O going low at 43 forces signal CLK_O to stay low after the transition to low at 45.

Because signal ENABLE_O transitions on the trailing edge of signal CLK_I, there is not a race condition between the inputs of AND gate 34 where one input is causing signal CLK_O to go high and the other input is causing signal CLK_O to go low.

Figure 5:
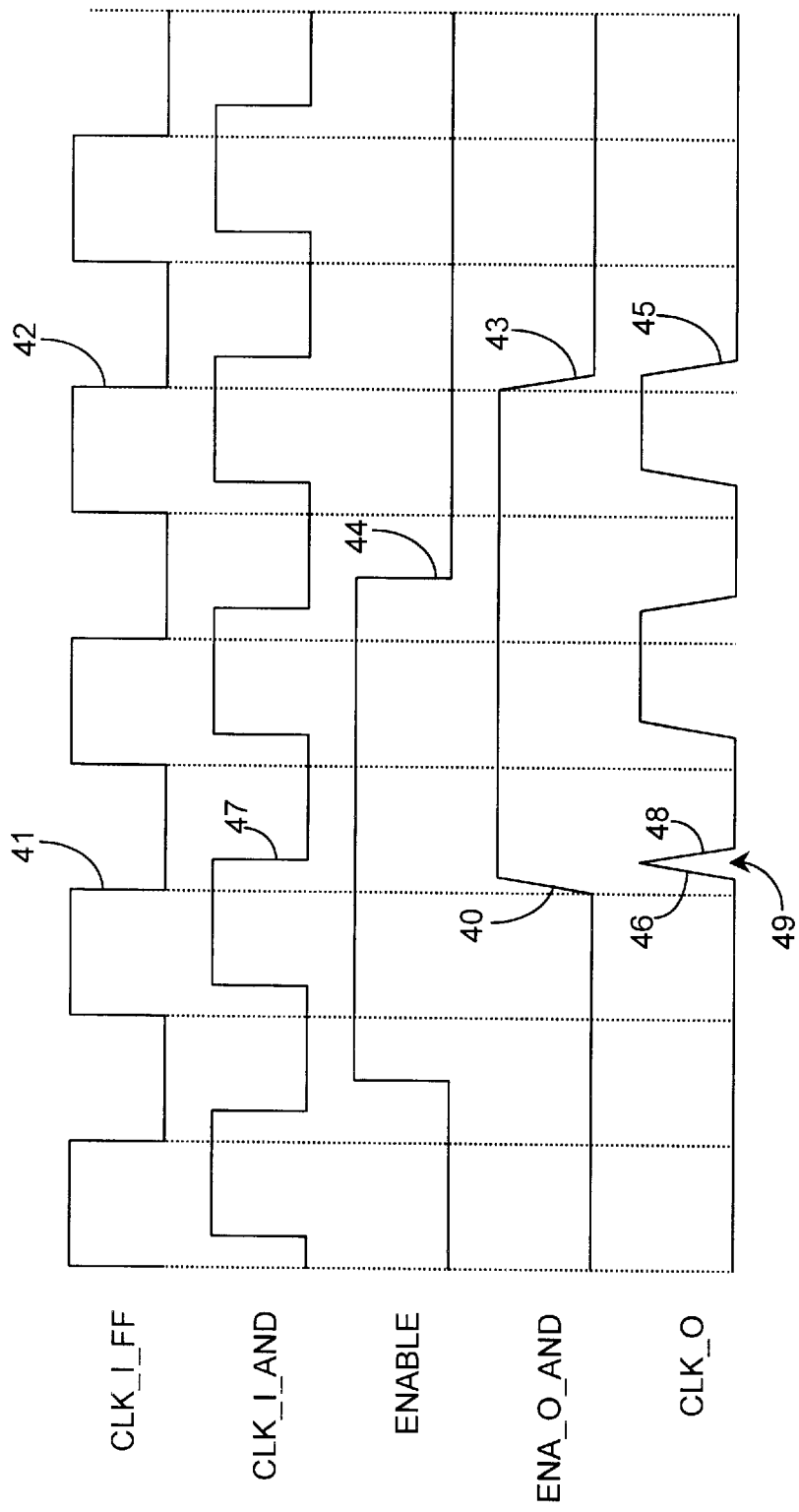
FIG. 5 shows a second timing diagram associated with the circuit illustrated in FIG. 3.

The circuit of FIG. 3 would appear to solve the glitch problem. However, this circuit is impractical for implementations of the present invention on field programmable gate array (FPGA) devices. A problem arises when signal ENABLE_O arrives at AND gate 34 significantly before signal CLK_I does, causing a glitch and a shortened pulse. This could occur due to signal routing delays in the FPGA. Because routing on an FPGA is not controllable by the circuit designer, routing delays need to be considered for circuit implementations on FPGA devices. FIG. 5 shows a timing diagram illustrating this problem. Signal CLK_I_FF represents input clock CLK_I as seen at the clock input of flip-flop 30. Signal CLK_I_AND represents input clock CLK_I as seen at AND gate 34. Signal ENA_O_O AND represents signal ENABLE_O as seen at AND gate 34. As shown in FIG. 5, trailing edge 41 of signal CLK_I_FF causes signal ENA_O_AND to go high at 40. This causes signal CLK_O to go high at 46 because signal CLK_I_AND is still high at this point. When signal CLK_I_AND goes low at 47, this causes signal CLK_O to go low at 48. Edges 46 and 48 of signal CLK_O define glitch 49. When signal ENA_O_AND goes low at 43, this causes signal CLK_O to go low at 45, causing a shortened pulse.

Another problem associated with the circuit of FIG. 3 is related to circuit design tools. Certain optimization and minimization routines of circuit generation software that is used by electrical engineers in circuit design may substitute the circuit of FIG. 1 for the circuit of FIG. 3, even though the designer specified the circuit of FIG. 3. Therefore, there still remains the need for a clock enable circuit design that will generate a glitch free output clock signal, even after undergoing the optimization and minimization of a circuit generation software package.

Figure 6:
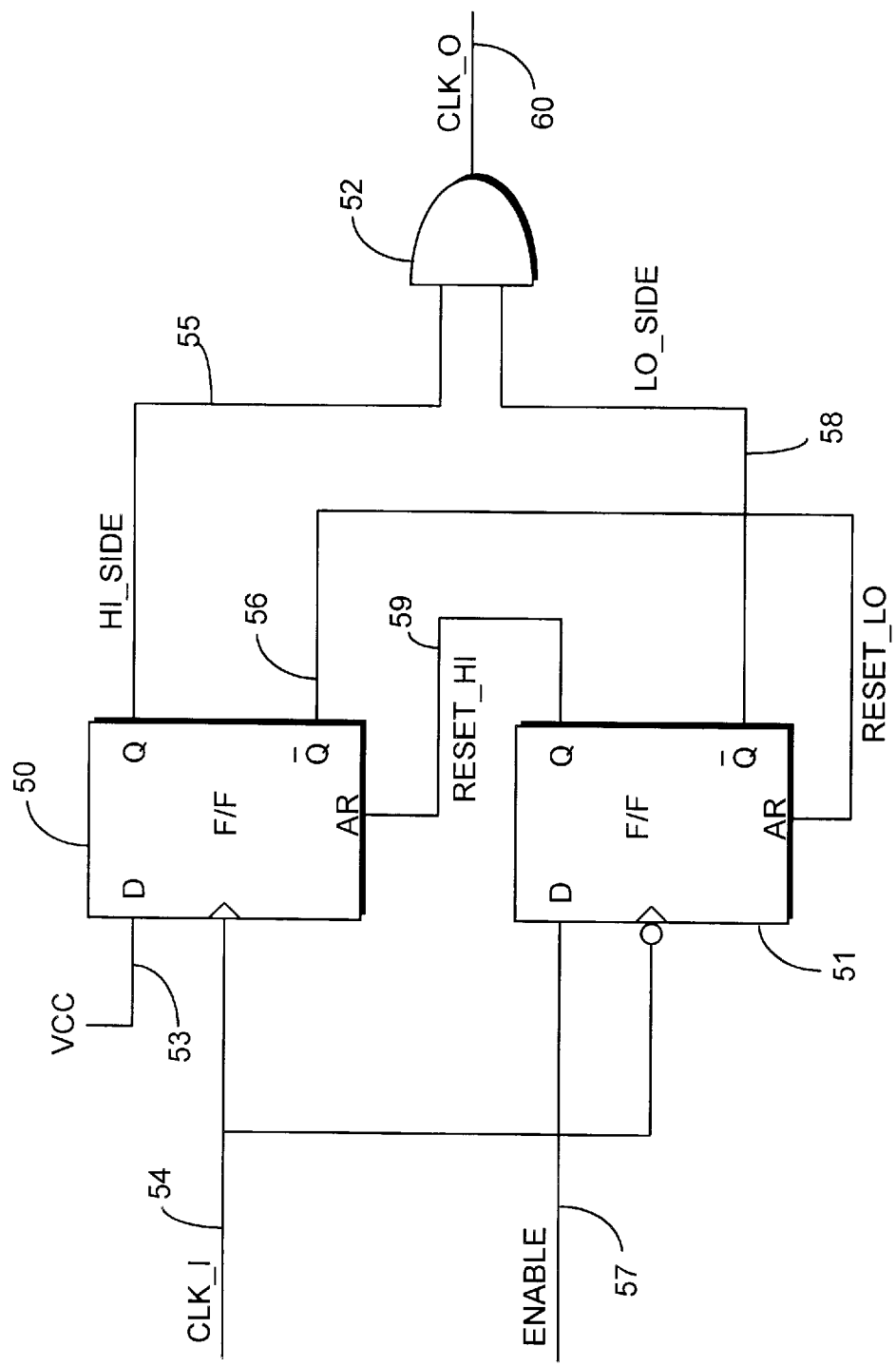
FIG. 6 shows a logic diagram of the clock enable circuit of the present invention.

FIG. 6 shows a logic circuit in accordance with the present invention that provides a glitch free clock enable circuit. The circuit comprises a first flip-flop 50 that is positive-edge triggered, a second flip-flop 51 that is negative-edge triggered, and an AND gate 52. First flip-flop 50 is connected to a constant positive voltage signal VCC over D input lead 53, and the positive-edge triggered clock input is connected to input clock signal CLK_I over lead 54. Q output lead 55 carries signal HI_SIDE and is connected to one input of AND gate 52, and Q-complement output lead 56 carries signal RESET_LO and is connected to the asynchronous reset input of second flip-flop 51. Second flip-flop 51 D input lead 57 is connected to clock output enable signal ENABLE, the negative-edge triggered clock input is connected to input clock signal CLK_I over lead 54, Q complement output lead 58 carries signal LO_SIDE and is connected to the second input of AND gate 52, and Q output lead 59 caries signal RESET_HI and is connected to the asynchronous reset of first flip-flop 50. The output of AND gate 52 is output clock signal CLK_O over lead 60.

Figure 7:
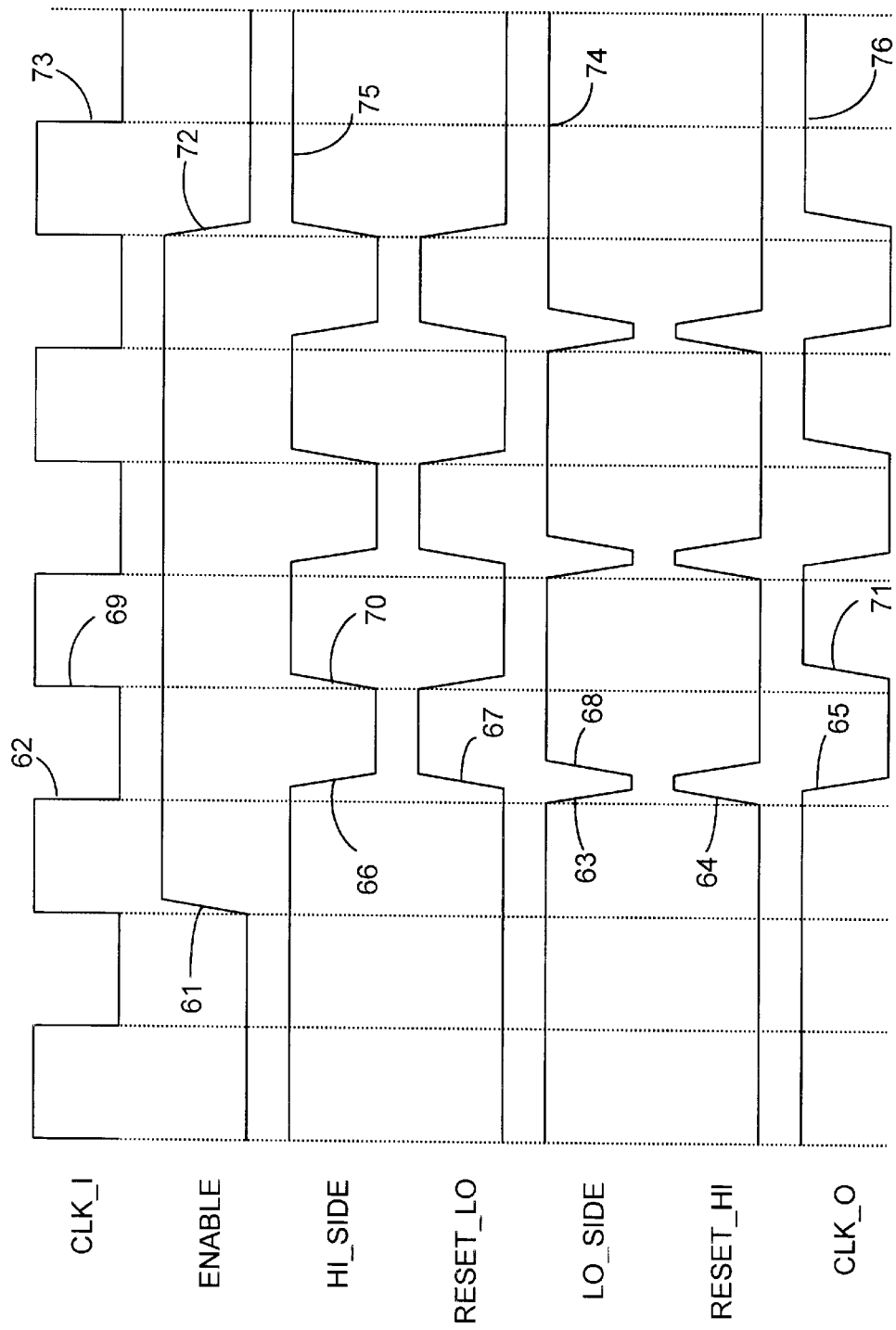
FIG. 7 shows the timing diagram associated with the circuit illustrated in FIG. 6.

FIG. 7 shows the timing diagram for the circuit of FIG. 6. As shown in FIG. 7, when signal ENABLE is low, the steady states of the signals after reset are HI_SIDE high, RST_LO low, LO_SIDE high, RESET_HI low, and CLK_O high. When signal HI_SIDE is high and signal LO_SIDE is high, output clock signal CLK_O will be high. As shown in FIG. 7, when signal ENABLE transitions to high at 61, the next trailing edge of signal CLK_I at 62 causes signal LO_SIDE to go low at 63 and signal RESET_HI to go high at 64. When signal LO_SIDE achieves high at 63, this causes signal CLK_O to go low at 65. Signal RESET_HI going high at 64 forces a reset of first flip-flop 50 which causes signal HI_SIDE to go low at 66 and signal RST_LO to go high at 67. Signal RST_LO going high at 67 forces a reset of second flip-flop 51 which causes signal LO_SIDE to go high at 68. The next leading edge of signal CLK_I at 69 causes signal HI_SIDE to transition to high at 70. When signal HI_SIDE achieves high at 70, this causes signal CLK_O to go high at 71.

When signal ENABLE goes low at 72, then at the next trailing edge of signal CLK_I at 73 signal LO_SIDE stays high at 74 which keeps signal HI_SIDE high at 75 and signal CLK_O high at 76.

Because AND gate 52 input signals HI_SIDE from flip-flop 50 and LO_SIDE from flip-flop 51 trigger off of opposite edges of input clock signal CLK_I, a race condition does not exist at AND gate 52, and output clock signal CLK_O on lead 60 is glitch free.

Figure 8:
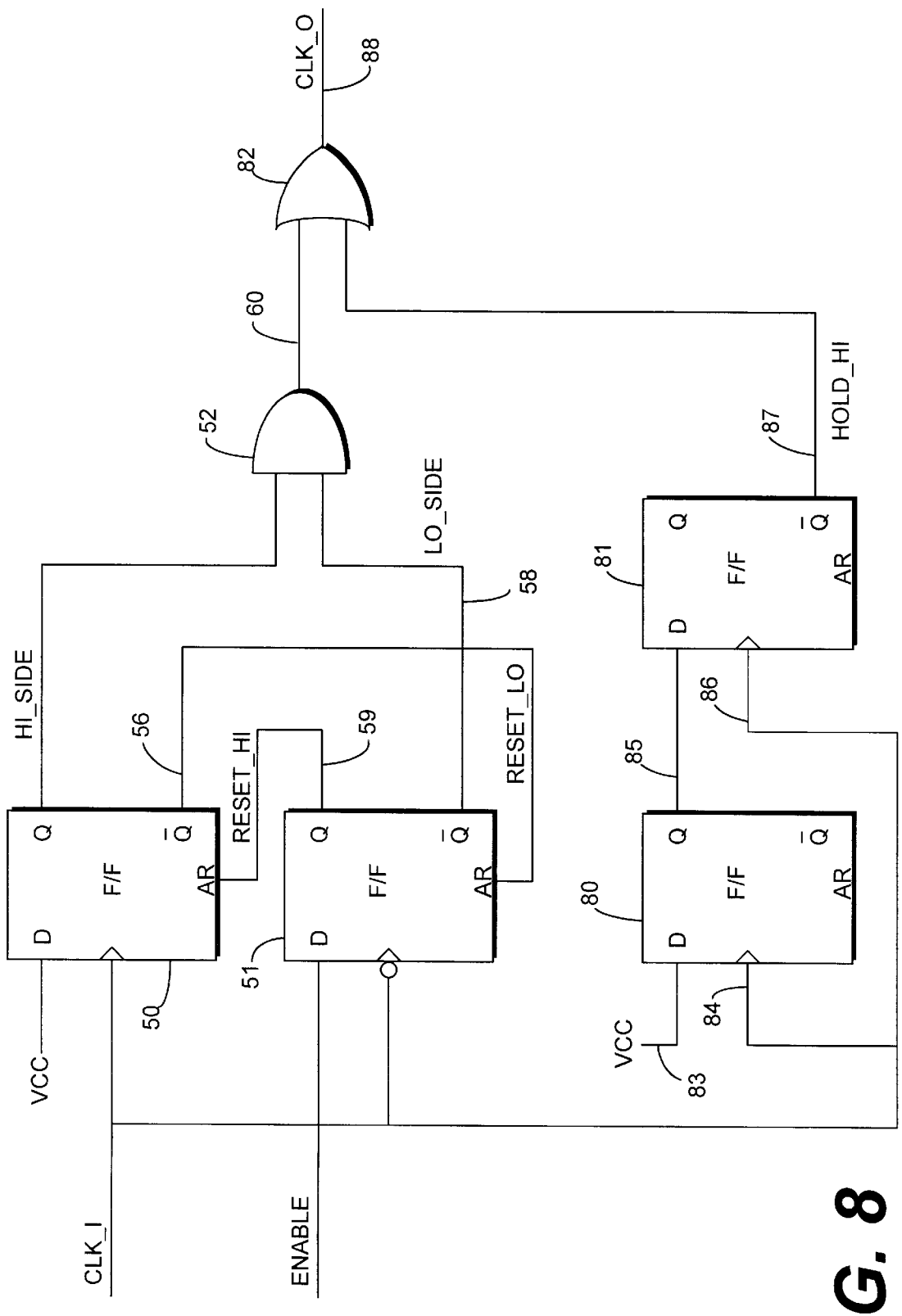
FIG. 8 shows a logic diagram of an alternative embodiment of the clock enable circuit of the present invention.
Figure 10:
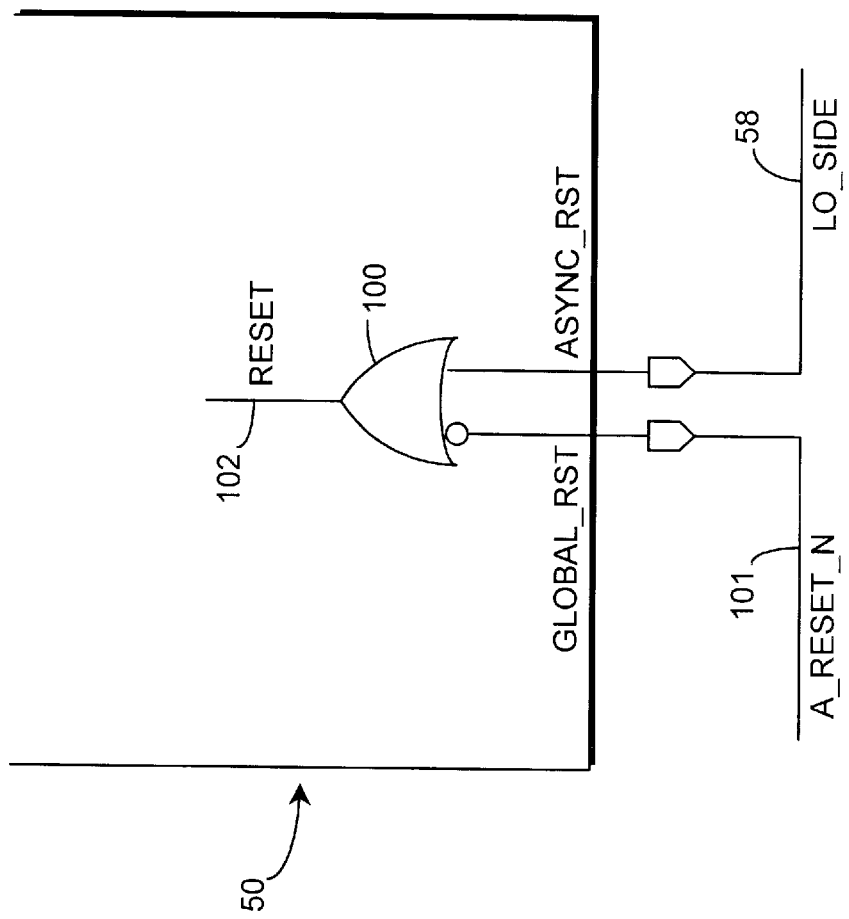
FIG. 10 shows a logic diagram of the asynchronous and global reset portion of flip-flops of the embodiment of the present invention illustrated in FIGS. 6 and 8.

FIG. 8 shows an enhancement to the circuit displayed in FIG. 6, comprising positive-edge triggered flip-flops 80 and 81, and OR gate 82. Flip-flop 80 is connected to constant positive voltage signal VCC over D input lead 83, and to input clock signal CLK_I over positive-edge triggered clock input lead 84. Q output lead 85 is connected to the D input of flip-flop 81. Flip-flop 81 is further connected to input clock signal CLK_I over positive-edge triggered clock input lead 86. Q-complement output lead 87 carries signal HOLD_HI and is connected to one input of OR gate 82. The other input lead of OR gate 82 is connected to the output signal of AND gate 52 over connection 60. Output lead 88 of OR gate 82 carries output clock signal CLK_O. This enhancement would be used in applications where flip-flops 50, 51, 80 and 81 each have global asynchronous reset inputs that, for example, are asserted at system or circuit power-up. These global asynchronous reset inputs are not shown in FIG. 8. FIG. 10, discussed below, shows an exemplary reset mechanism that may be found on the flip-flops of the present invention.

Figure 9:
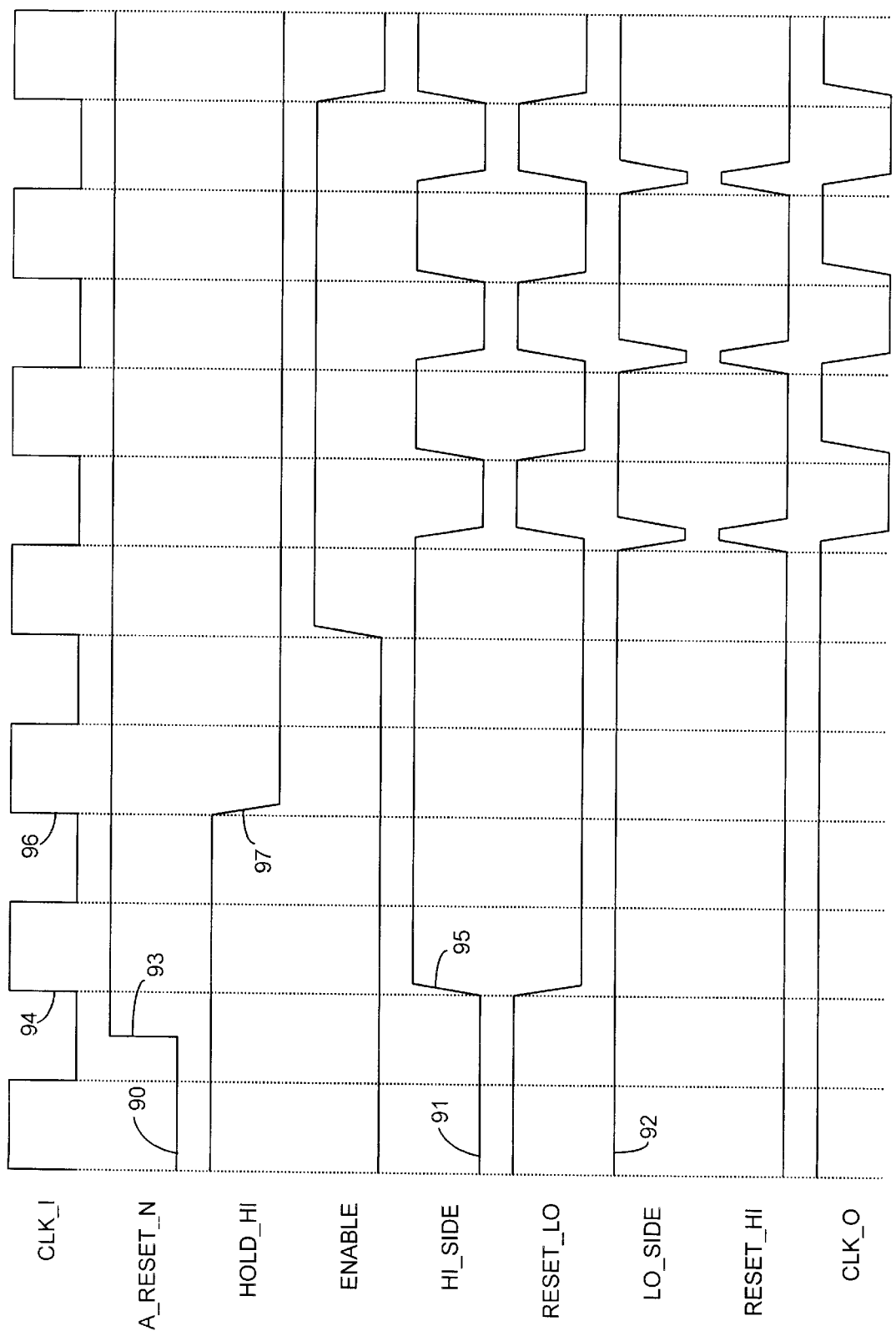
FIG. 9 shows the timing diagram associated with the circuit illustrated in FIG. 8.

FIG. 9 shows a timing diagram for the circuit of FIG. 8. At the time of, for example, a system or circuit power-up, active-low global asynchronous reset signal A_RESET_N is asserted at 90 to set flip-flops 50, 51, 80 and 81 into a known state. This forces signals HI_SIDE at 91 to be low and LO_SIDE at 92 to be high, which in turn causes the output signal of AND gate 52 on lead 60 to be low.

When signal A_RESET_N is deasserted at 93, the next leading edge of signal CLK_I at 94 causes signal HI_SIDE to transition high at 95. This, in turn, causes the output signal of AND gate 52 on lead 60 to be go high.

In some applications, certain downstream circuits may be sensitive to this initial transition from low to high. The enhancement shown in FIG. 8 eliminates this initial transition in clock output signal CLK_O . As can be seen, the arrangement of flip-flops 80 and 81 will cause the second leading edge of signal CLK_I at 96 after A_RESET_N goes high at 93 to in turn cause signal HOLD_HI to go low at 97. Because signal HOLD_HI is forced high when global reset signal A_RESET_N is asserted, and stays high for one clock cycle after signal HI_SIDE goes high at 95, the initial transition from low to high of the output signal of AND gate 52 on lead 60 is masked.

After this transition at 97, signal CLK_O will follow the output signal of AND gate 52 on lead 60. From this point forward, the circuit acts as described in the discussion of the circuit of FIG. 6.

FIG. 10 shows the reset mechanism employed in flip-flops 50, 51, 80 and 81 of the present invention. The reset mechanism, as shown in, for example, flip-flop 50, comprises OR gate 100 having one inverted input. Signal LO SIDE on lead 58 is connected to the non-inverted asynchronous reset input of OR gate 100. This flip-flop input signal is designated as AR in accompanying FIGS. 5 and 7. Active-low global asynchronous reset signal A RESET_N on lead 101 is connected to the inverted input of OR gate 100. Flip-flop asynchronous reset signal RESET is carried on output lead 102 of OR gate 100.

In operation, global asynchronous reset signal A_RESET_N would be associated with the power-up or reset logic of the system containing the clock enable circuit of the present invention. The asynchronous reset signal, for example, signal LO_SIDE, is associated with the local operational logic of the circuit of the present invention. Asserting either reset signal will force the flip-flop into a low state. For simplicity of illustration, the global asynchronous reset signals are not illustrated in the accompanying drawings.

The circuit of the present invention will produce a clock output signal that doesn't glitch and has a constant duty cycle regardless of the timing of the clock enable signal ENABLE input. The circuit can be implemented using discrete logic components, or using a field programmable gate array (FPGA), for example, a Lucent Technologies model 2C08A FPGA.

While the inventive system has been particularly shown and described, it is not intended to be exhaustive nor to limit the invention to the embodiment disclosed. It will be apparent to those skilled in the art that modifications can be made to the present invention without departing from the scope and spirit thereof. It is intended that the scope of the invention be defined by the claims appended hereto and their equivalents.

What is claimed is:

1. A glitch free clock enable circuit for use in a digital system having a source of an input clock signal of first and second characteristics, a source of a clock enable signal of said first and second characteristics, and a source of a fixed state signal, said glitch free clock enable circuit comprising:

a first storage circuit operable to generate a first output signal of said first and second characteristics;

a second storage circuit operated in response to said input clock signal changing from said second characteristic to said first characteristic and said fixed state signal to generate a second output signal of said first characteristic, and further operated in response to said first output signal of said first characteristic to generate said second characteristic of said second output signal while said first output signal is of said first characteristic, and further operated in response to said first output signal of said first characteristic to generate a third output signal of a said first characteristic while said first output signal is of said first characteristic, and further operated in response to said input clock signal changing from said second characteristic to said first characteristic and said fixed state signal to generate said second characteristic of said third output signal;

said first storage circuit operated in response to said input clock signal changing from said first characteristic to said second characteristic and said clock enable signal of said first characteristic to generate said first output signal of said first characteristic, and further operated in response to said input clock signal changing from said first characteristic to said second characteristic and said clock enable signal of said second characteristic to generate said first output signal of said second characteristic, and further operated in response to said third output signal of said first characteristic to generate said first output signal of said second characteristic while said third output signal is of said first characteristic, and further operated in response to said input clock signal changing from said first characteristic to second characteristic and said clock enable signal of said second characteristic to generate a fourth output signal of said first characteristic, and further operated in response to said input clock signal changing from said first characteristic to said second characteristic and said clock enable signal of said first characteristic to generate said second characteristic of said fourth output signal, and further operated in response to said third output signal of said first characteristic to generate said fourth output signal of said first characteristic while said third output signal is of said first characteristic; and a combinatorial logic circuit operated in response to said second output signal of said first characteristic and said fourth output signal of said first characteristic to generate a clock output signal of a said first characteristic, and further operated in response to said second output signal of said second characteristic or said fourth output signal of said second characteristic to generate said clock output signal of said second characteristic.

2. The glitch free clock enable circuit of claim 1 wherein said first and second storage circuits comprise flip-flops.

3. The glitch free clock enable circuit of claim 1 wherein said first and second storage circuits comprise D flip-flops.

4. The glitch free clock enable circuit of claim 1 wherein said combinatorial logic circuit comprises an AND gate.

5. The glitch free clock enable circuit of claim 1 wherein said glitch free clock enable circuit comprises a field programmable gate array.

* * * * *